(12) United States Patent
Freer et al.

(10) Patent No.: US 8,480,810 B2
(45) Date of Patent: *Jul. 9, 2013

(54) METHOD AND APPARATUS FOR PARTICLE REMOVAL

(75) Inventors: Erik M. Freer, Campbell, CA (US); John M. de Larios, Palo Alto, CA (US); Katrina Mikhaylichenko, San Jose, CA (US); Michael Ravkin, Sunnyvale, CA (US); Mikhail Korolik, San Jose, CA (US); Fritz C. Redeker, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/543,365

(22) Filed: Oct. 4, 2006

(65) Prior Publication Data
US 2007/0151583 A1 Jul. 5, 2007

Related U.S. Application Data

(60) Provisional application No. 60/755,377, filed on Dec. 30, 2005.

(51) Int. Cl.
*B08B 7/04* (2006.01)
(52) U.S. Cl.
USPC ........... 134/6; 134/7; 134/21; 134/32; 134/33
(58) Field of Classification Search
USPC .............................. 134/6, 7, 21, 26, 32, 33, 42
See application file for complete search history.

(56) References Cited

U.S. PATENT DOCUMENTS

| | | | |
|---|---|---|---|
| 3,617,095 A | 11/1971 | Lissant | |
| 3,978,176 A | 8/1976 | Voegeli | |
| 4,838,289 A | 6/1989 | Kottman et al. | |
| 5,048,549 A | 9/1991 | Hethcoat | |
| 5,062,898 A * | 11/1991 | McDermott et al. | 134/7 |
| 5,209,028 A * | 5/1993 | McDermott et al. | 451/89 |
| 5,271,774 A | 12/1993 | Leenaars et al. | |
| 5,364,474 A * | 11/1994 | Williford, Jr. | 134/32 |
| 5,447,574 A * | 9/1995 | Inoue | 134/18 |
| 5,464,480 A | 11/1995 | Matthews | |
| 5,660,642 A | 8/1997 | Britten | |

(Continued)

FOREIGN PATENT DOCUMENTS

| CN | 1539161 A | 10/2004 |
|---|---|---|
| DE | 40 38 587 A1 | 6/1992 |

(Continued)

OTHER PUBLICATIONS

Hunter, "Introduction to Modern Colloid Science," Oxford University Press, Feb. 1994.

(Continued)

*Primary Examiner* — Saeed T Chaudhry
(74) *Attorney, Agent, or Firm* — Martine Penilla Group, LLP

(57) ABSTRACT

A method and system for cleaning a surface, having particulate matter thereon, of a substrate features impinging upon the surface a jet of a liquid having coupling elements entrained therein. A sufficient drag force is imparted upon the coupling elements to have the same move with respect to the liquid and cause the particulate matter to move with respect to the substrate.

19 Claims, 8 Drawing Sheets

U.S. PATENT DOCUMENTS

| | | | |
|---|---|---|---|
| 5,705,223 A | 1/1998 | Bunkofske | |
| 5,785,068 A | 7/1998 | Sasaki et al. | 134/144 |
| 5,858,283 A | 1/1999 | Burris | |
| 5,865,901 A * | 2/1999 | Yin et al. | 134/2 |
| 5,900,191 A | 5/1999 | Gray et al. | |
| 5,944,582 A | 8/1999 | Talieh | |
| 5,945,351 A | 8/1999 | Mathuni | |
| 5,964,954 A | 10/1999 | Matsukawa et al. | |
| 5,997,653 A | 12/1999 | Yamasaka | |
| 6,066,032 A * | 5/2000 | Borden et al. | 451/80 |
| 6,081,650 A | 6/2000 | Lyons et al. | |
| 6,090,217 A | 7/2000 | Kittle | |
| 6,152,805 A | 11/2000 | Takahashi | |
| 6,167,583 B1 | 1/2001 | Miyashita et al. | |
| 6,228,563 B1 | 5/2001 | Starov et al. | |
| 6,267,125 B1 | 7/2001 | Bergman et al. | |
| 6,272,712 B1 | 8/2001 | Gockel et al. | |
| 6,276,459 B1 | 8/2001 | Herrick et al. | |
| 6,290,780 B1 | 9/2001 | Ravkin | |
| 6,296,715 B1 * | 10/2001 | Kittle | 134/2 |
| 6,386,956 B1 | 5/2002 | Sato et al. | |
| 6,395,693 B1 * | 5/2002 | Wang | 510/175 |
| 6,398,975 B1 | 6/2002 | Mertens et al. | |
| 6,401,734 B1 | 6/2002 | Morita et al. | |
| 6,439,247 B1 | 8/2002 | Kittle | |
| 6,457,199 B1 | 10/2002 | Frost et al. | |
| 6,491,764 B2 | 12/2002 | Mertens et al. | |
| 6,493,902 B2 | 12/2002 | Lin | |
| 6,537,915 B2 | 3/2003 | Moore et al. | 438/692 |
| 6,594,847 B1 | 7/2003 | Krusell et al. | |
| 6,616,772 B2 | 9/2003 | De Larios et al. | |
| 6,797,071 B2 | 9/2004 | Kittle | |
| 6,802,911 B2 | 10/2004 | Lee et al. | |
| 6,846,380 B2 | 1/2005 | Dickinson et al. | |
| 6,851,435 B2 | 2/2005 | Mertens et al. | |
| 6,874,516 B2 | 4/2005 | Matsuno et al. | |
| 7,122,126 B1 | 10/2006 | Fuentes | |
| 7,138,362 B2 * | 11/2006 | Abe et al. | 510/175 |
| 2002/0094684 A1 * | 7/2002 | Hirasaki et al. | 438/689 |
| 2002/0121290 A1 | 9/2002 | Tang et al. | |
| 2002/0157686 A1 | 10/2002 | Kenny et al. | |
| 2002/0185164 A1 | 12/2002 | Tetsuka et al. | |
| 2003/0171233 A1 * | 9/2003 | Abe et al. | 510/175 |
| 2003/0171239 A1 | 9/2003 | Patel et al. | |
| 2003/0226577 A1 | 12/2003 | Orll et al. | |
| 2004/0053808 A1 | 3/2004 | Raehse et al. | |
| 2004/0221877 A1 | 11/2004 | Bergman | 134/34 |
| 2004/0261823 A1 | 12/2004 | De Larios | |
| 2005/0067000 A1 | 3/2005 | Kosugi | 134/18 |
| 2005/0132515 A1 | 6/2005 | Boyd et al. | |
| 2005/0133060 A1 | 6/2005 | De Larios et al. | |
| 2005/0133061 A1 | 6/2005 | De Larios et al. | |
| 2006/0128590 A1 * | 6/2006 | Freer et al. | 510/417 |
| 2006/0201267 A1 | 9/2006 | Liu | |
| 2006/0283486 A1 | 12/2006 | De Larios et al. | |
| 2006/0285930 A1 | 12/2006 | Korolik et al. | |
| 2007/0000518 A1 | 1/2007 | De Larios et al. | |
| 2007/0079848 A1 * | 4/2007 | Freer et al. | 134/2 |

FOREIGN PATENT DOCUMENTS

| | | |
|---|---|---|
| EP | 0905746 A1 | 3/1999 |
| JP | 5924849 | 2/1984 |
| JP | 62119543 | 5/1987 |
| JP | 5-15857 | 1/1993 |
| JP | 11 334874 | 12/1999 |
| JP | 11350169 | 12/1999 |
| JP | 2002-66475 | 3/2002 |
| JP | 2002 280330 | 9/2002 |
| JP | 2002-309638 | 10/2002 |
| WO | WO 99/16109 | 4/1999 |
| WO | WO 00/33980 | 6/2000 |
| WO | WO 00/59006 | 10/2000 |
| WO | WO 01/12384 A2 | 2/2001 |
| WO | WO 02/101795 | 12/2002 |
| WO | WO 2005/006424 | 1/2005 |

OTHER PUBLICATIONS

Weaire et al, "The Physics of Foams," Department of Physics, Trinity College, Dublin, 1999.

Lester, M.A., "Is Foam Wafer Cleaning and Drying the Future?" <htttp://www.aquafoam.com/papers/SC10202.pdf>, Semiconductor International, 25, #2 (Feb.), 42 (2002).

Kittle, P.A., "Particulate Removal Using a Foam Medium," http://www.aquafoam.Com/papers/particulate.pdf>, Jan. 2002.

Kittle et al., "Photoresist Removal Using Aqueous Foam," http://www.aquafoam.com/papers/A2C2photoresist.pdf, 2001.

Kittle et al., "Foam Wafer Cleaning—Experimental Proof of Concept," http://www.aquafoam.com/papers/Proof-11MB.pdf.>.

Kittle, P.A., "Aqueous Foam Drying and Cleaning of Semiconductor Wafers," http://www.aquafoam.com/papers/SCCPresentation.pdf>, Apr. 2004.

Kittle, "Removing Particles with a Foam Medium," <http://www.aquafoam.com/papers/A2C2foammedium.pdf>, A2C2, p. 11-15, Jan. 2002.

Kittle, P.A., "Semiconductor Wafer Cleaning and Drying Using a Foam Medium," http://www.aquafoam.com/papers/NWCWG.pdf>, Sematech Novel Wafer Cleans Working Group Meeting Internet Presentation, Nov. 13, 2001.

Kittle et al., "Photoresist Residue Removal Using Aqueous Foam Proof of Concept Experiments," <http://www.aquafoam.com/papers/Removalall.pdf>,<papers/A2C2Pphotoresist.pdf>, pp. 13-17, May 2002.

Kirkpatrick et al., "Advanced Wafer-Cleaning Evolution," Solid State Technology, May 2003, www.solid-state.com.

Lide, "Air Composition," CRC Handbook of Chemistry and Physics, 1997.

U.S. Appl. No. 11/639,752, filed Dec. 15, 2006, Boyd et al.
U.S. Appl. No. 11/743,283, filed May 2, 2007, Freer et al.

\* cited by examiner

METHOD AND APPARATUS FOR PARTICLE REMOVAL

CLAIM OF PRIORITY

This application claims the benefit of U.S. Provisional Application No. 60/755,377, filed Dec. 30, 2005. The disclosure of this patent application is incorporated by reference herein for all purposes.

CROSS REFERENCE TO RELATED APPLICATIONS

This application is related to U.S. patent application Ser. No. 10/608,871, filed Jun. 27, 2003, and entitled "Method and Apparatus for Removing a Target Layer from a Substrate Using Reactive Gases"; U.S. patent application Ser. No. 10/816,337, filed on Mar. 31, 2004, and entitled "Apparatuses and Methods for Cleaning a Substrate"; U.S. patent application Ser. No. 11/173,132, filed on Jun. 30, 2005, and entitled "System and Method for Producing Bubble Free Liquids for Nanometer Scale Semiconductor Processing"; U.S. patent application Ser. No. 11/153,957, filed on Jun. 15, 2005, and entitled "Method and Apparatus for Cleaning a Substrate Using Non-Newtonian Fluids"; U.S. patent application Ser. No. 11/154,129, filed on Jun. 15, 2005, and entitled "Method and Apparatus for Transporting a Substrate Using Non-Newtonian Fluid"; U.S. patent application Ser. No. 11/174,080, filed on Jun. 30, 2005, and entitled "Method for Removing Material from Semiconductor Wafer and Apparatus for Performing the Same"; U.S. patent application Ser. No. 10/746,114, filed on Dec. 23, 2003, and entitled "Method and Apparatus for Cleaning Semiconductor Wafers using Compressed and/or Pressurized Foams, Bubbles, and/or Liquids"; U.S. patent application Ser. No. 11/336,215 filed on Jan. 20, 2006, and entitled "Method and Apparatus for Removing Contamination from Substrate"; U.S. patent application Ser. No. 11/346,894, filed on Feb. 3, 2006, and entitled "Method for Removing Contamination From a Substrate and for Making a Cleaning Solution"; and U.S. patent application Ser. No. 11/347,154 filed on Feb. 3, 2006, and entitled "Cleaning Compound and Method and System for Using the Cleaning Compound". The disclosure of each of these related applications is incorporated herein by reference for all purposes.

BACKGROUND

There exists a desire reduce critical dimensions of features in products. As the features decrease in size, the impact of contamination during processing of the features increases, which may produce defects. Exemplary contaminants are particulates that include polysilicon slivers, photoresist particles, metal oxide particles, metal particles, slurry residue, dust, dirt, as well as various elementary molecules such as carbon, hydrogen, and/or oxygen. Particulates frequently adhere to a surface by weak covalent bonds, electrostatic forces, van der Waals forces, hydrogen bonding, coulombic forces, or dipole-dipole interactions, making removal of the particulates difficult.

Historically, particulate contaminants have been removed by a combination of chemical and mechanical processes. These processes employ cleaning tools and agents that have a probability of introducing additionally contaminants during a cleaning process.

Another technique for cleaning substrate surfaces omits the use of chemical agents by exposing the surface to high heat in to vaporize contaminants present thereon. The vapors are removed by evacuating a chamber in which the surface is present. The high temperatures required for this process limits its application to post deposition processes not involving material having a structure that varies at temperatures proximate to the vaporization temperature of the contaminants.

Another cleaning technique is disclosed in U.S. Pat. No. 6,881,687 and employs a laser-clean yield-enabling system. The system incorporates a laser cleaning operation working in conjunction with a defect inspection operation cooperating to feed information regarding the root cause of the remaining defects back to earlier process stages, for correction of the root causes, with resultant improvement in yield. In a simplest configuration, the particles remaining after a laser cleaning would be characterized as to their types, sizes, shapes, densities, locations, and chemical compositions in order to deduce the root causes of the presence of those particular particles. This information is used to improve the yield of subsequent product wafers being processed so that their yields are higher than the wafers characterized. It is desired, however, to provide a more robust cleaning process that avoids the presence of particulate contaminants remaining on the surface that has been subjected to a cleaning process.

Therefore, a need exists to provide improved techniques to clean substrate surfaces.

SUMMARY OF THE INVENTION

A method and system for cleaning a surface, having particulate matter thereon, of a substrate features impinging upon the surface a jet of a liquid having coupling elements entrained therein. The method includes impinging upon the surface a jet of a liquid having coupling elements entrained therein; and imparting sufficient momentum upon the coupling elements to move within the liquid and impart a quantity of said momentum upon the particulate matter, with said quantity being of sufficient magnitude to cause said particulate matter to move with respect to said substrate. The present invention is based upon the belief that the liquid in which the coupling elements are entrained forms a barrier between the coupling elements and the particulate contaminants that impedes interaction of the coupling elements with the particulate contaminants. This is believed to reduce the effectiveness of the coupling elements to remove the particulate contaminants from the surface of the substrate. The present invention attenuates, if not avoids, the barrier effect of the liquid by forming a jet of the liquid. The momentum of the coupling elements in the jet coupled with the impact of the liquid on the surface is believed to increase a probability that the coupling elements will interact with and remove the particulate contaminants. For lower velocities of the liquid jet, the entrained coupling elements experience a fluid drag. This drag force can be transferred directly to the particulate matter through interaction with the coupling element in which a sufficient force is generated to remove the contamination. Thus, the present invention can also operate in flow regimes where viscous forces dominate. Other aspects and advantages of the invention will become more apparent from the following detailed description, taken in conjunction with the accompanying drawings, illustrating by way of example the present invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE INVENTION

In the following description numerous specific details are set forth in order to provide a thorough understanding of the present invention. It will be apparent, however, to one skilled in the art that the present invention may be practiced without some or all of these specific details. In other instances, well known process operations have not been described in detail in order not to unnecessarily obscure the present invention.

Figure 1:
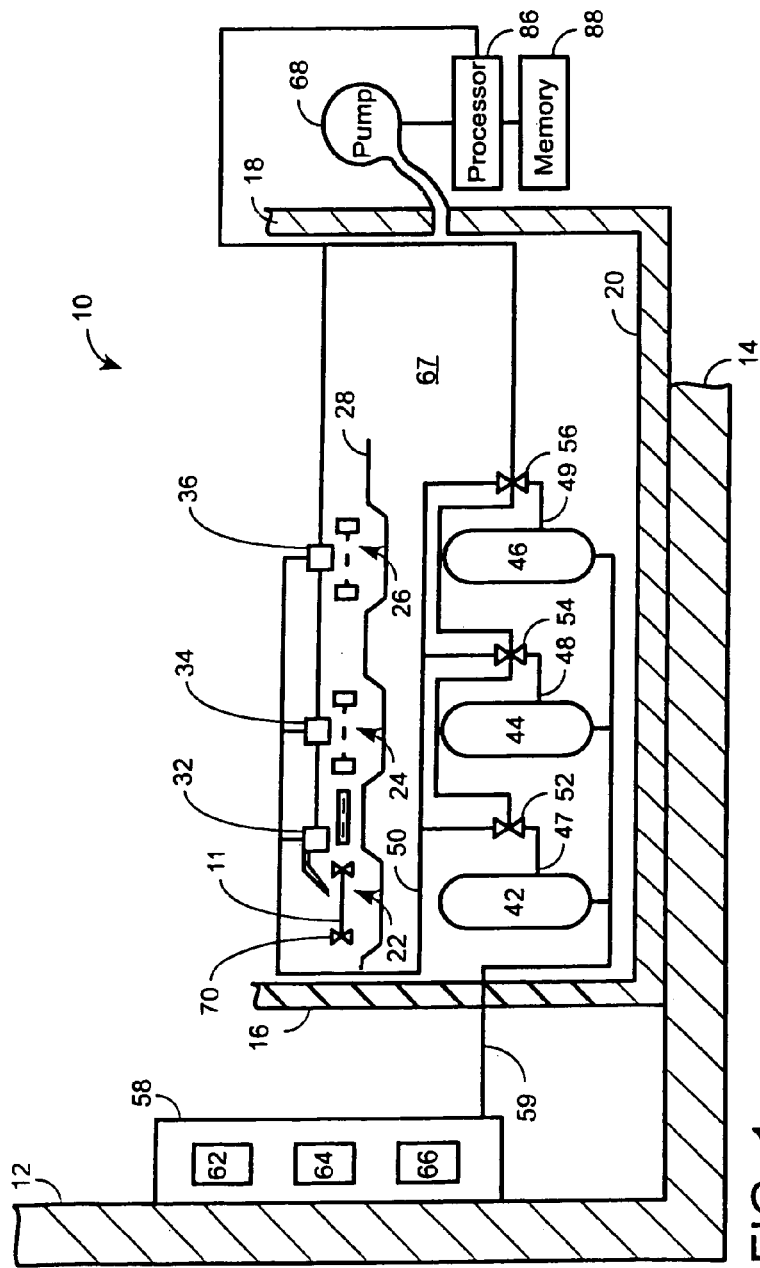
FIG. 1 is a simplified side view of an exemplary substrate cleaning system in which one embodiment of the present invention may be incorporated.

Referring to FIG. 1 a system 10 employed to clean substrates 11 is positioned within a clean room, a wall and floor of which is shown as 12 and 14, respectively. System 10 includes a housing, opposed walls 16 and 18 of which are shown with a floor 20 extending therebetween. System 10 includes a plurality of processing regions, shown as 22, 24 and 26, which are located at portions of a tray 28 having recesses formed therein. Associated with each of processing regions 22, 24 and 26 is a liquid applicator system (LAS) to deposit chemicals upon substrate 11 when present in one of processing regions 22, 24 and 26 in furtherance of cleaning substrate 11. Specifically, LAS 32 is associated with processing region 22, LAS 34 is associated with processing region 34 and LAS 36 is associated with processing region 26. To that end, containers of chemicals, shown as 42, 44 and 46 are selectively placed in fluid communication with one or more of LASes 32, 34 and 36 via lines 47, 48, 49 and 50 and mass flow controllers MFC 52, 54 and 56.

Containers 42, 44 and 46 are provided with the appropriate chemicals via a wall supply 58 in fluid communication with the same over line 59. Wall supply 58 is in fluid communication with storage tanks (not shown) of appropriate chemicals that are outside of the clean room and, therefore, wall 12 to selectively place chemicals in storage tanks (not shown) in fluid communication with containers 42, 44 and 46 through valves 62, 64 and 66. Although only three containers 42, 44 and 46 are shown, as well as three valves 62, 64 and 66, many additional containers and valves may be included to facilitate control of numerous chemicals used in the processes carried-out by system 10. Exemplary chemicals that may be employed to that end include isopropyl alcohol (IPA), carbon dioxide ($CO_2$), nitrogen ($N_2$), ethyl glycol, deionized water (DIW), ammonia ($NH_3$), hydrogen fluoride (HF), argon (Ar), oxygen ($O_2$), hydrogen peroxide ($H_2O_2$), hydrogen ($H_2$), hydrochloric acid (HCl), ozone ($O_3$), ammonium Peroxide ($NH_4OH$), and/or combinations thereof, for example, a de-foaming agent referred to herein as SC-1 solution ($NH_4OH/H_2O_2/H_2O$). Although not shown, system 10 may be completely enclosed defining a chamber 67. To control the pressure in system 10, a pump 68 may be placed in fluid communication with chamber 67.

Figure 2:
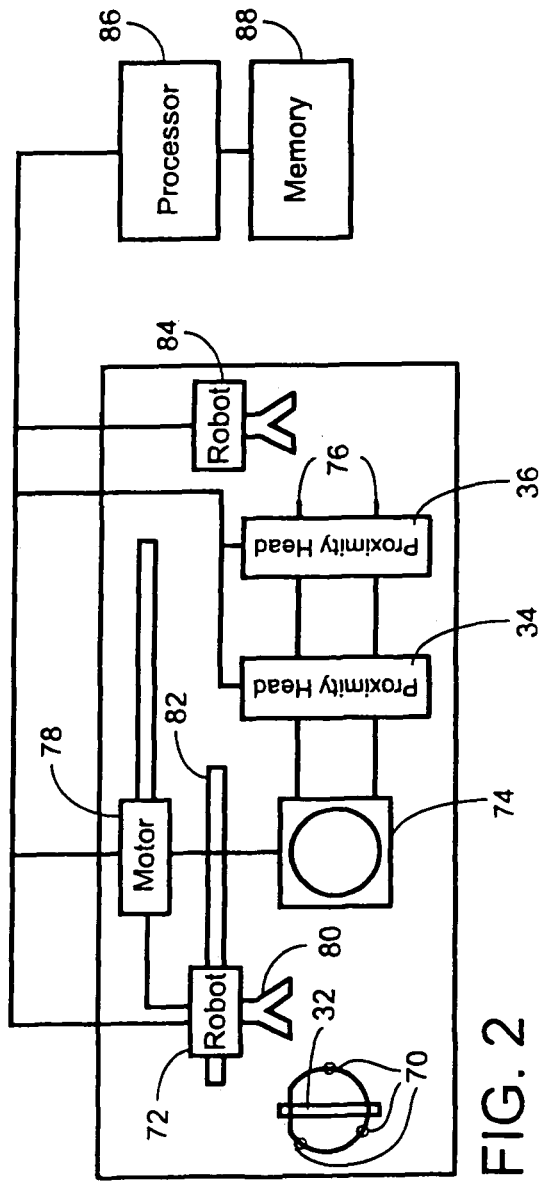
FIG. 2 is a simplified top down view of an exemplary substrate cleaning system in which one embodiment of the present invention may be incorporated.

Referring to both FIGS. 1 and 2, substrate may be supported in processing region 22 by carrier rollers 70. Other suitable technique for moving a wafer may also include holding prongs (not shown), a moving carrier tray (not shown), robotics and tracks. In this example, moving substrate 11 to processing regions 24 and 26 is achieved by a robot 72 and a carrier subsystem. Carrier sub-system includes a moveable stage 74 coupled to reciprocate between opposed ends of a pair of spaced-apart rails 76 and selectively place substrate 11 in processing region 24 and 26. To that end, a motor 78 is coupled to moveable stage 74 to provide the necessary locomotion employing suitable mechanisms, e.g., worm gears, or direct drive gears and the like. Robot 72 includes a pair of handling arms 80 to lift and move substrate 11 between roller carrier 70 and moveable stage 74 and is mounted to reciprocate between processing regions 22 and 24 along a track 82 under power of motor 80. Disposed opposite to robot 72 may be an additional robot 84 that is the same design as robot 72. Robot 84 operates to remove substrate 11 from moveable stage 74 upon exiting processing region 26. Operation of the various sub-systems are controlled by a processor 86 operating on computer-readable instructions present in memory 88 that is in data communication with processor 86. System 10 may also be connected to a local area network, a metropolitan area network and/or a wide area network. Specifically, processor 86 is in data communication with LASes 32, 34 and 36, MFCs 52, 54 and 56, motor 78 robots 80 and 84, as well as pump 68 to control operations thereof.

Figure 3:
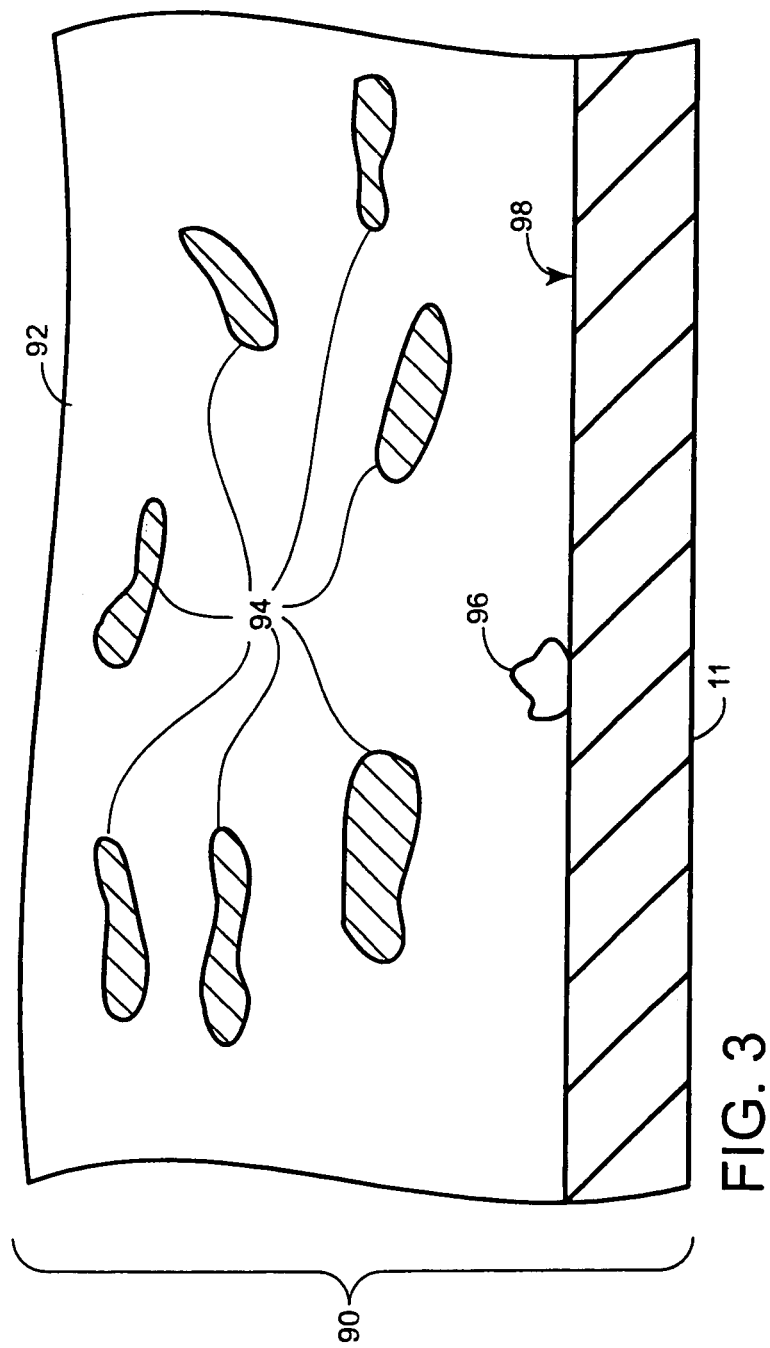
FIG. 3 is a plan view showing a liquid employed to remove particulate contaminants from a substrate surface in accordance one embodiment of the present embodiment.
Figure 4:
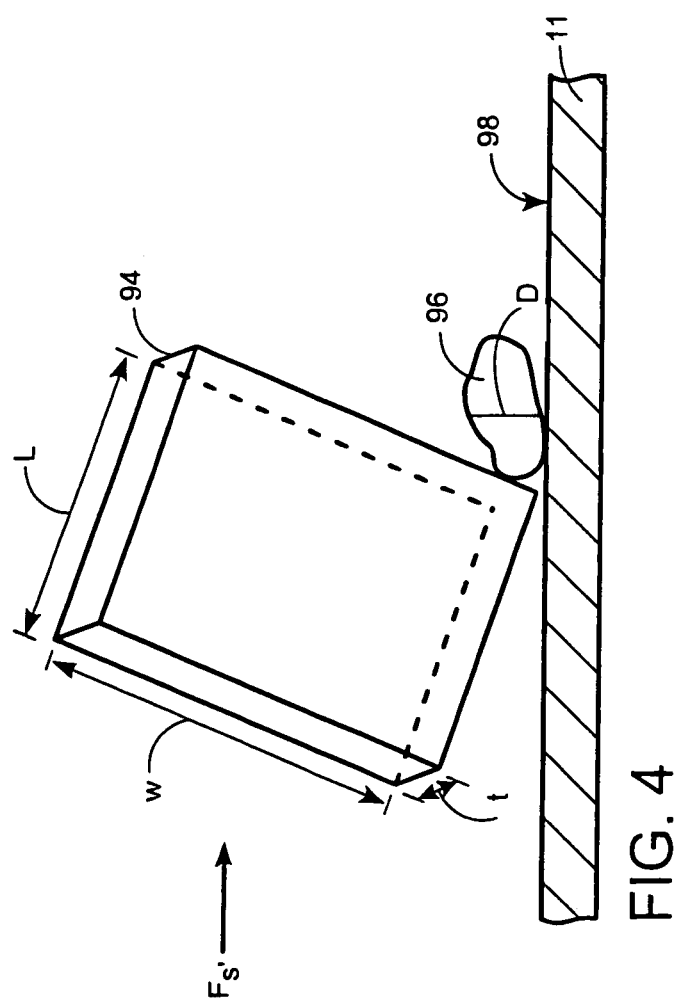
FIG. 4 is demonstrating the relative cross-sectional areas of malleable regions in the suspension in relation to contaminants in Figure in accordance with the present invention.
Figure 5:
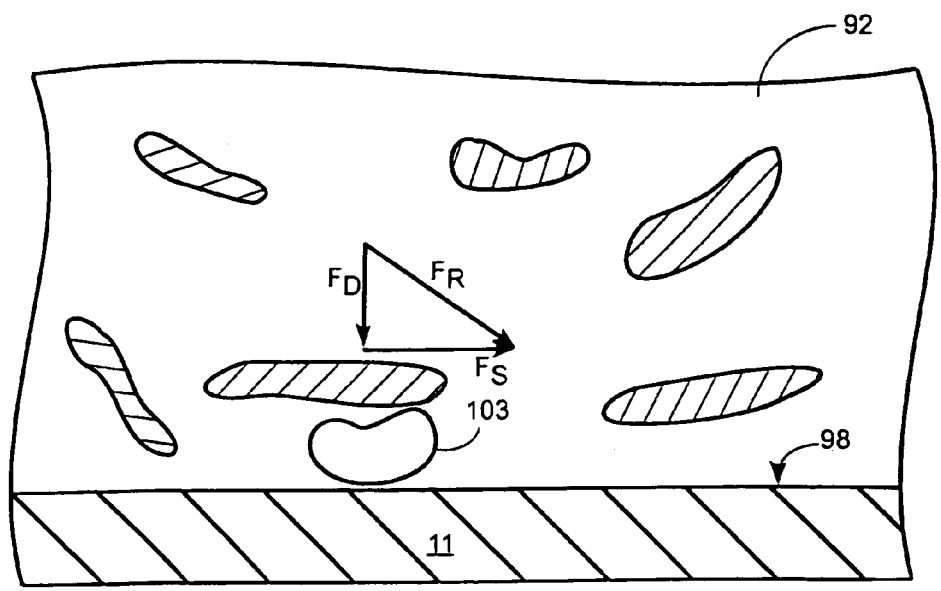
FIG. 5 is plan view of a liquid employed shown in FIG. 4 demonstrating the forces exerted on a particulate in furtherance of removing the particulate contaminant from the wafer surface in accordance with the present invention.

Referring to FIG. 3, an exemplary liquid that may egress from LASes 32, 34 and 36 includes a suspension 90 having multiple regions, with differing flow characteristics so that the flow characteristics associated with one of the regions differs from the flow characteristics associated with the remaining regions. In the present example, suspension 90 includes a liquid region 92 and a coupling element 94. Liquid region 92 has a first viscosity associated therewith. Coupling element 94 may comprise rigid solid bodies, malleable solid bodies or solid bodies having fluidic characteristics, i.e., solid bodies having a viscosity that is much greater than the viscosity associated with liquid region 92. Coupling elements 94 are entrained throughout a volume of liquid region 92 such that liquid region 92 functions as a transport for coupling elements 94 in furtherance of placing coupling elements 94 proximate to particulate contaminants 96 present on a surface 98 of substrate 11.

Coupling elements 94 consist of a material capable of removing contaminants 96 from surface 98 through transfer of forces from suspension 90, i.e., movement of liquid regions 92, to contaminant 96 via coupling elements 94. Thus, it is desired to provide coupling elements 94 with a cross-sectional area sufficient to remove contaminant 96 from surface 98. Typically, the cross-sectional area of coupling elements 94 is greater than a cross-sectional area of contaminant 96. In this manner, movement of contaminant 96 in response to a drag force $\vec{F}_d$ acting upon coupling element 94 is facilitated, with the understanding that drag force $\vec{F}_d$ includes both a frictional forces $\vec{F}_{fc}$ and normal forces, with the normal forces including momentum. Drag force $\vec{F}_d$ is a function of the physical properties and relative velocities associated with liquid region 92 and coupling elements 94.

Friction force $\vec{F}_{fc}$, the tangential component of drag force $\vec{F}_d$, on the surface of contaminant 96 is a function of the shear stress at the contaminant surface multiplied by the surface area of the contaminant: $\vec{F}_{fc}=\vec{\tau}_c A_c$. The friction force $\vec{F}_f$ acting upon the coupling element is the shear stress at the coupling element surface multiplied by the surface area of the coupling element: $\vec{F}_f=\vec{\tau} A$. A coupling element 94 in contact with contamination 96 directly transfers its friction force. Thus, the contaminant experiences an apparent shear stress that is a ratio of the coupling element 94 to contaminant 96 surface areas. Specifically, the apparent shear force $\vec{\tau}_c$ to which contaminant experiences is $$\vec{\tau}_c \vec{\tau} A/A_c$$

where A is the cross-section area of coupling element 94 and $A_c$ is the cross-sectional area of contaminant 96. Assume, for example, that an effective diameter, D, of contaminant 96 is less than about 0.1 micron and a width, W, and length, L, of coupling element 94 are each between about 5 microns to about 50 microns. Assuming a thickness, t, of coupling element 94 is between about 1 to about 5 microns, the ratio (or stress multiplier) could range between 2,500 to about 250,000. This number will increase when the normal forces are included in the drag force $\vec{F}_d$ calculation. Coupling element 94, shown in FIG. 4, is discussed with respect to being a hexahedron for ease of discussion. However, it should be understood that coupling elements are of substantially arbitrary shapes and that the length, L, width, W, and thickness, t, referred to above is the average value for coupling elements 94 in suspension.

Referring to FIG. 5, forces transferred to contaminant 96 via coupling elements 94 occur through coupling of coupling elements 94 to contaminant through one or more various mechanisms. To that end, liquid region 92 exerts a downward force $\vec{F}_D$ on coupling elements 94 within liquid region 92 such that coupling elements 94 are brought within close proximity or contact with contaminants 96 on surface 98. When coupling element 94 is moved within proximity to or contact with contaminant 96, coupling may occur between coupling element 94 and contaminant 96. The coupling mechanism that results is a function of the materials, and properties thereof, from which coupling elements 94 and contaminant 96 are formed. Coupling element 94 and contaminant 96 is sufficient to allow the transfer of a force of sufficient magnitude to overcome an adhesive force between contaminant 96 and surface 98, as well as any repulsive forces between coupling element 94 and contaminant 96. Thus, upon coupling element 94 moving away from surface 98 by a shear force $\vec{\tau}$ contaminant 96 that is coupled thereto is also moved away from surface 98, i.e., contaminant 96 is cleaned from surface 98.

One such coupling mechanism is mechanical contact between coupling elements 94 and contaminant 96. To that end, coupling elements 94 may be more or less malleable than contaminant 96. In an embodiment wherein coupling elements 94 are more malleable than contaminants 96, the force imparted upon contaminant 96 is reduced due to deformation of coupling elements 94 occurring from impact with contaminant 96. As a result, contaminant 96 may become imprinted within coupling element 94 and/or entangled in a network of coupling elements 94. This may produce a mechanical linkage between coupling element 94 and contaminant 96, fixing the relative position therebetween. Mechanical stresses may be transferred of coupling elements 94 to contaminant 96, thereby increasing the probability that contaminant 96 is broken free from surface 98. Additionally, a chemical coupling mechanism, such as adhesion between contaminant 96 and coupling elements 94, may occur.

Where coupling elements 94 and contaminant 96 are sufficiently rigid, a substantially elastic collision would occur resulting in a significant transfer of energy from coupling elements 94 to contaminant 96, thereby increasing the probability that contaminant 96 is broken free from surface 98. However, the chemical coupling mechanism of adhesion between coupling elements 94 and contaminant 96 may be attenuated, which may reduce the probability gained by the collision.

In addition, to mechanical and chemical coupling mechanisms discussed above, electrostatic coupling may occur. For example, were coupling element 94 and contaminant 96 to have opposite surface charges they will be electrically attracted. It is possible that the electrostatic attraction between coupling element 94 and contaminant 96 can be sufficient to overcome force connecting contaminant 96 to surface 98. It should be realize that one or more the aforementioned coupling mechanisms may be occurring at any given time with respect to one or more contaminants 96 on surface. In addition, this may occur randomly or be induced by having coupling element 94 formed from different materials and having different shaped and hardness. Alternatively, the electrostatic repulsive interaction between the approaching coupling element 94 and the contaminant 96 may be strong enough to dislodge the contaminant 96 from the surface 98.

Exemplary embodiments of suspension 90 include liquid region 92 having a viscosity between about 1 Centipoises (cP) to about 10,000 cP. Moreover, liquid regions 92 may be a Newtonian fluid or a non-Newtonian fluid. Exemplary materials that may be employed as liquid region 92 include deionized water (DIW), hydrocarbon, a fluorocarbon, a mineral oil, or an alcohol and the like. Furthermore, suspension 90 may include ionic or non-ionic solvents and other chemical additives. For example, the chemical additives to suspension 90 can include any combination of co-solvents, pH modifiers, chelating agents, polar solvents, surfactants, ammonia hydroxide, hydrogen peroxide, hydrofluoric acid, tetramethylammonium hydroxide, and rheology modifiers such as polymers, particulates, and polypeptides.

Coupling elements 94 may possess physical properties representing essentially any sub-state such that in addition to the properties set forth above, do not adhere to surface 98 when positioned in close proximity or contact with surface 98. Additionally, the damage caused to surface 98 by coupling elements 94 should be deminimus, as well as the adhesion between coupling elements 94 and surface 98. In one embodiment, the hardness of coupling elements 94 is less than the hardness of surface 98. Moreover, it is desired that coupling element 94 avoiding adherence to surface 98 when positioned in either close proximity to or in contact with surface 98. Various embodiments coupling elements 94 may be defined as crystalline solids or non-crystalline solids. Examples of non-crystalline solids include aliphatic acids, carboxylic acids, paraffin, wax, polymers, polystyrene, polypeptides, and other visco-elastic materials. To that end, the quantity of coupling elements 94 in suspension 90 should be present at a concentration that exceeds its solubility limit within liquid region 92.

It should be understood that the aliphatic acids represent essentially any acid defined by organic compounds in which carbon atoms form open chains. A fatty acid is an example of an aliphatic acid that can be used as coupling element 94 within suspension 90. Examples of fatty acids that may be used as coupling elements 94 include lauric, palmitic, stearic, oleic, linoleic, linolenic, arachidonic, gadoleic, eurcic, butyric, caproic, caprylic, myristic, margaric, behenic, lignoseric, myristoleic, palmitoleic, nervanic, parinaric, timnodonic, brassic, clupanodonic acid, lignoceric acid, cerotic acid, and mixtures thereof, among others.

In one embodiment, coupling elements 94 may represent a mixture of fatty acids formed from various carbon chain lengths extending from C-1 to about C-26. Carboxylic acids are defined by essentially any organic acid that includes one or more carboxyl groups (COOH). When used as coupling elements 94, the carboxylic acids can include mixtures of various carbon chain lengths extending from C-1 through about C-100. Also, the carboxylic acids can include other functional groups such as but not limited to methyl, vinyl, alkyne, amide, primary amine, secondary amine, tertiary amine, azo, nitrile, nitro, nitroso, pyridyl, carboxyl, peroxy, aldehyde, ketone, primary imine, secondary imine, ether, ester, halogen, isocyanate, isothiocyanate, phenyl, benzyl, phosphodiester, sulfhydryl, but still maintaining insolubility in suspension 90.

One manner by which to form suspension 90 with regions formed from carboxylic acid components includes presenting liquid regions 92 as a gel that is formed from a concentration of carboxylic acid solids, such as between about 3% to about 5% and preferably between about 4% to about 5%, with De-ionized water (DIW). The concentration may be heated to between 75° C. to about 85° C., inclusive to facilitate the solids going into solution, i.e., dissolving. Once the solids are dissolved, the cleaning solution can be cooled down. During the cooling down process, solid compounds in the form of needles or plates would precipitates. An exemplary suspension 90 formed in this manner has a viscosity of about 1000 cP at 0.1 per second shear rate and the viscosity falls to about 10 cP when the shear rate increases to 1000 per second, i.e., it is a non-Newtonian fluid. It should be understood that suspension may be formed by carboxylic acid(s) (or salts) in solvents other than water, polar or non-polar solvents, such as alcohol, may be employed.

Another embodiment of suspension 90 coupling elements 94 are formed from a hydrolyzed chemical agent, or by including a surfactant. For example, a dispersant material may be included in liquid region 92 to facilitate dispersal of coupling element 94 throughout suspension 90. To that end, a base can be added to suspension 90 to enable entrainment of coupling elements 94 from materials such as carboxylic acid or stearic acid that are present in less than stoichiometric quantities. An exemplary base is Ammonium Hydroxide, however, any commercially available base may be used with the embodiments described herein. Additionally, the surface functionality of the materials from which coupling elements 94 are formed may be influenced by the inclusion of moieties that are miscible within suspension 90, such as carboxylate, phosphate, sulfate groups, polyol groups, ethylene oxide, etc. In this manner, it may be possible to disperse coupling elements 94 throughout suspension 90 while avoiding unwanted conglomeration of the same, i.e., form a substantially homogenous suspension 90. In this manner, avoided may be a situation in which a conglomeration of coupling elements 94 becomes insufficient to couple to and/or remove contaminant 96 from surface 98.

Figure 6:
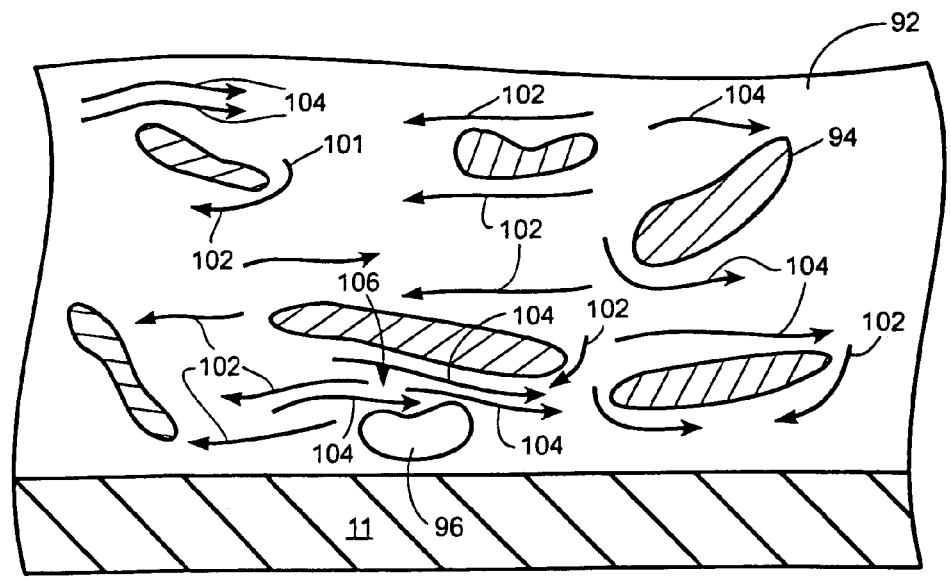
FIG. 6 is plan view of the liquid shown in FIGS. 4 and 5 demonstrating the barrier region presented by the liquid to coupling elements entrained therein.
Figure 7:
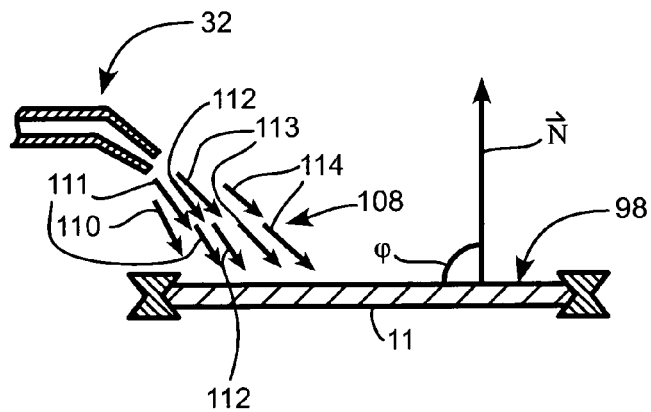
FIG. 7 is a detailed view showing operation of a LAS shown in FIG. 1, in accordance with one embodiment of the present invention.
Figure 8:
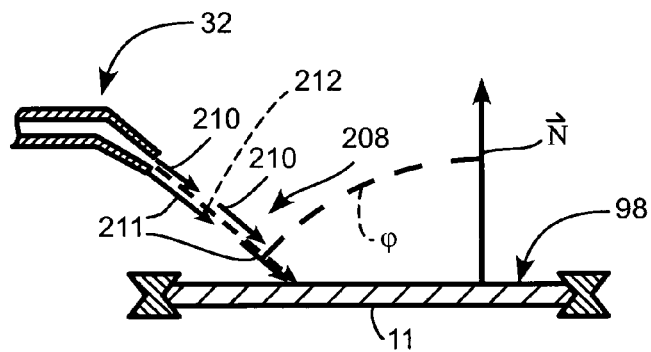
FIG. 8 is a detailed view showing operation of a LAS shown in FIG. 1, in accordance with a first alternate embodiment of the present invention.
Figure 9:
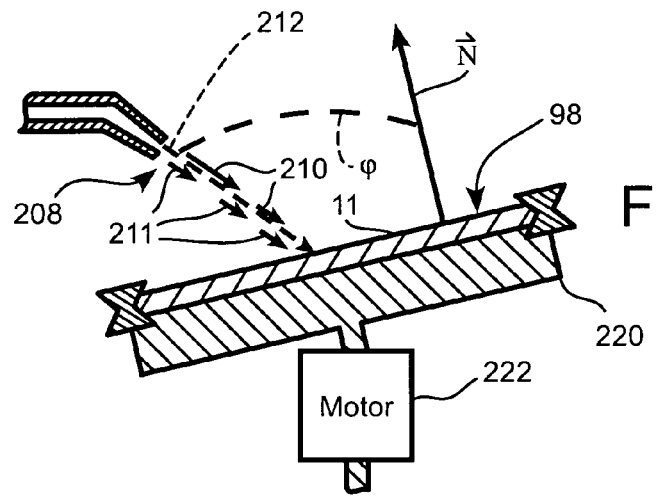
FIG. 9 is a detailed view showing operation of a LAS shown in FIG. 1, in accordance with a second alternate embodiment of the present invention.
Figure 10:
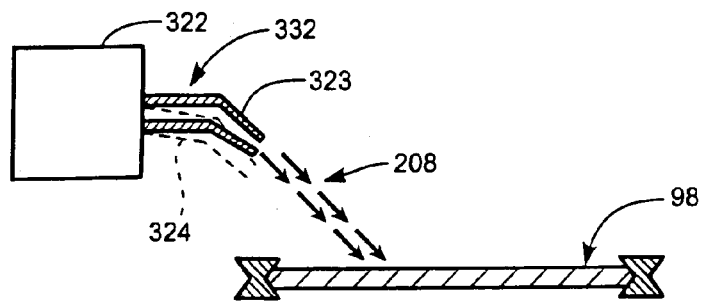
FIG. 10 is a detailed view showing operation of a LAS shown in FIG. 1, in accordance with a third alternate embodiment of the present invention.
Figure 11:
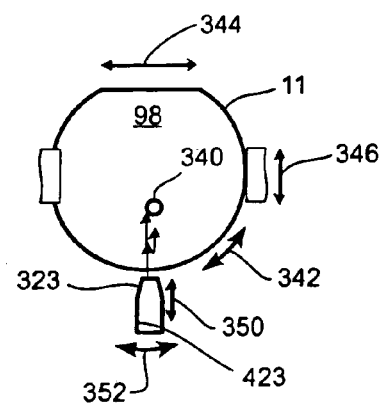
FIG. 11 is a detailed view showing operation of a LAS shown in FIG. 1, in accordance with a fourth alternate embodiment of the present invention.

Referring to FIGS. 6 and 7, a problem encountered concerned the generation of lubrication layer created by lubrication layers, shown as 102 and 104 in liquid region 92. The present of lubrication layers 102 and 104 in a hiatus 106 between contaminant 96 and one or more of coupling elements 94 may prove problematic. Specifically, a viscous resistance of lubrication layers 102 and 104 may prevent mechanical coupling to occur between coupling element 94 and contaminant 96 due to, inter alia, diffusion of the momentum of coupling elements 94. One manner in which to avoid the drawbacks presented by lubrication layers 102 and 104 is to generate turbulence in liquid region 92, i.e. attenuates the effects of laminar flows that may be present in lubrication layers 102 and 104. To that end, LAS 32 directs a jet 108 of suspension 90 at a sufficient velocity to impart sufficient momentum upon coupling elements 94 to allow the same to propagate through liquid region 92 and impact with contaminant. The momentum imparted upon regions should be sufficient to overcome viscous resistance of lubrication layers 102 and 104 and impart a sufficient drag force $\vec{F}_D$ to move contaminant from surface 98, as discussed above. Specifically, the difference in mass and density between liquid regions 92 and coupling elements 94, coupled with the velocity imparted upon suspension 90 by LAS 32, results in coupling elements 94 continuing to propagate toward surface 98 at a higher rate of velocity, than liquid regions 92, upon and after impact of suspension with substrate 98. As a result, it is believed that the viscous resistance associated with lubrication layers 102 and 104 is overcome by coupling element 94 allowing the same to couple with contaminant 96 or, the viscous resistance of lubrication layers 102 and 104 is diminished by creation of turbulence that result from the movement of coupling elements 94 through liquid regions 92. As shown, jet 108 includes a plurality of streams, shown generally as 112-116, each of which concurrently impinges upon surface 98 at a different angle $\phi$, measured with respect to a normal $\vec{N}$ to surface 98. As shown, the angle $\phi$ is typically obtuse.

Referring to FIG. 8, in another embodiment, LAS 32 may be implemented to provide a jet 208 in which multiple streams, shown as 210 and 211 impinge upon surface so as to be substantially parallel, i.e., impinge upon surface 98 at a common angle $\phi$. Specifically, streams 210 and 211 are directed along a path 212, such that the path is parallel to streams 210 and 211.

Referring to FIG. 9, it is possible to impinge jet 208 upon surface 98 at a plurality of different angles, sequentially. To that end, substrate 11 may be mounted upon a pedestal 220 coupled to a motor 222 that facilitate changing an angle $\phi$ of normal $\vec{N}$ with respect to a path 212 of jet 208. Alternatively, a nozzle 323 of LAS 332 may coupled to a motor 322 to facilitate impinging jet 208 at differing angles φ, as demonstrated by dashed lines representing nozzle 324, shown in FIG. 10.

Referring to FIGS. 7, 8, 9, 10 and 11, in one embodiment either of jet 108 or jet 208 may impinge upon surface 98 as a localized spot 340. To ensure substantially all of the area of surface 98 is exposed to spot 340 or line (not shown) relative movement between substrate 11 and LAS 32 and a nozzle 423 may be undertaken. To that end, substrate 11 may be rotated to move in direction 342 and/or translate along two transversely extending directions 344 and 346. Alternatively, or in addition thereto, nozzle 423 may move along directions indicated by arrow 348 and translate along transversely extending directions indicated by one or more arrows 350 and 352. While movement occurs along directions indicated by arrows, 342, 344, 346 and/or 352 angle φ may be varied so that either jet 108 or jet 208 may be scanned over surface 98 at different angles measured from normal $\vec{N}$. Alternatively, angle φ may be changed after movement has occurred along directions indicated by one or more arrows 342, 344, 346 and/or 352. In this manner, spot 340 or line (not shown) may be scanned across, or over, an entire area of surface 98, or any sub-portion thereof, following any path desired, e.g., parallel stripes, serpentine stripe and the like. Specifically, either jet 108 or 208 may impinge upon surface 98 at different angles φ while relative movement between surface 11 and jet 108 or jet 208 occurs along a plane that extends transversely to the jet 108 or jet 208, i.e., that plane in which surface 98 lies.

Figure 12:
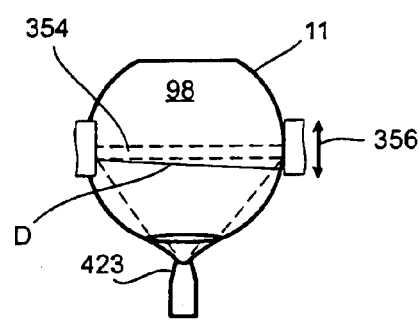
FIG. 12 is a detailed view showing operation of a LAS shown in FIG. 1, in accordance with a fifth alternate embodiment of the present invention.

Referring to 7, 8, 9, 10 and FIG. 12, shown is an embodiment in which either 108 or jet 208 impinges upon surface 98 as a line 354 extending across a diameter D of substrate 11. Line is moved over an area of surface by generating relative motion between nozzle 323 and substrate 11 along direction indicated by arrow 356. This relative motion may be achieved by moving substrate 11, nozzle 423 or both. It should be understood that the width of substrate 11 presented to line 354 changes as relative motion occurs along the direction indicated by arrow 356. To that end, nozzle 423 may be adapted to vary dynamically as relative motion between substrate 11 and nozzle 423 occurs along the directions indicated by arrow 356. In this manner, line 354 may be provided with a width that is substantially commensurate with the width of substrate 11. Alternatively, the width of line 354 may be established to be at least as wide as the widest area of substrate 11, if not wider. As movement occurs along directions indicated by arrow 356, angle φ may be varied so that either jet 108 or jet 208 may be scanned over surface 98 at different angles measured from normal $\vec{N}$. Alternatively, angle φ may be changed after movement has occurred along directions indicated by one or more arrows 342, 344, 346 and/or 352. In this manner, spot 340 or line (not shown) may be scanned across, or over, an entire area of surface 98, or any sub-portion thereof, following any path desired, e.g., parallel stripes, serpentine stripe and the like at different angles φ. Specifically, either jet 108 or 208 may impinge upon surface 98 at different angles φ while relative movement between surface 11 and jet 108 or jet 208 occurs along a plane that extends transversely to the jet 108 or jet 208, i.e., that plane in which surface 98 lies.

Figure 13:
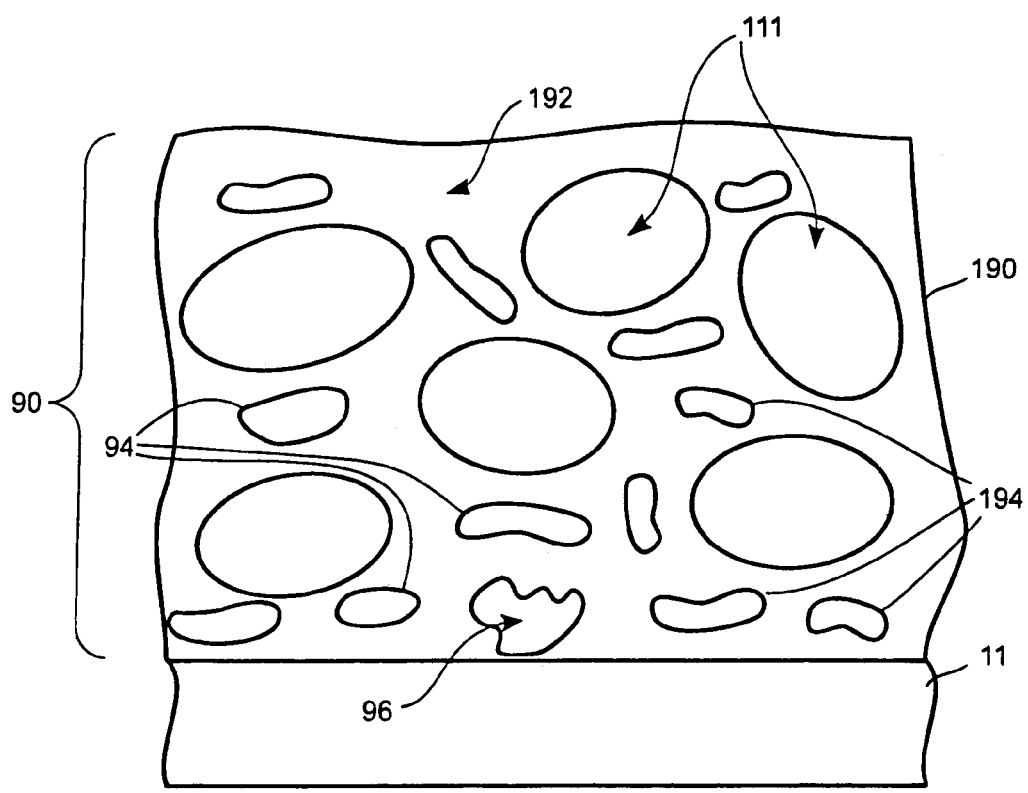
FIG. 13 is a plan view showing a liquid employed to remove particulate contaminants from a substrate surface in accordance with another embodiment of the present invention.

Referring to FIG. 13, in another alternate embodiment, suspension 190 may include an additional component, referred to as an immiscible component 111 that is entrained in liquid region 192. Immiscible components include may include a gas phase, a liquid phase, a solid phase of material, or a combination thereof. In the present example, immiscible components 111 are regions comprising entirely of a plurality of spaced-apart gas pockets dispersed throughout liquid region 192 of suspension 190. The immiscible components comprise from 5% to 99.9%, inclusive suspension 190 by volume. Alternatively, immiscible components may comprise 50% to 95%, inclusive, of suspension 90 by weight. Exemplary gas phase immiscible components 111 may be formed from the following gases: nitrogen, $N_2$, argon, Ar, oxygen, $O_2$, ozone, $O_3$, hydrogen peroxide, $H_2O_2$, air, hydrogen, $H_2$, ammonium, $NH_3$, hydrofluoric acid, HF.

Liquid phase immiscible components 111 may include a low-molecular weight alkane, such as, pentane, hexane, heptane, octane, nonane, decane, or mineral oil. Alternatively, liquid phase immiscible components 111 may include oil soluble surface modifiers.

Referring to both FIGS. 3 and 13, suspension 190 functions substantially similar to suspension 90 with respect to removing contaminant 96, with coupling elements 194 being substantially similar to coupling elements 94 and liquid region 192 being substantially similar to liquid region 92. In suspension 190, however, immiscible component 111 is believed to facilitate placing coupling elements 194 in contact with, or close proximity to, contaminant 96. To that end, one or more of regions in close proximity to, or contact with contaminant 96, is disposed between contaminant 96 and one or more immiscible components 111. Having a surface tension associated therewith, immiscible component 111 subjects coupling elements 194 to a force (F) on coupling element 194 in response to forces in liquid region 192. The force (F) moves coupling element 194 toward surface 98 and, therefore, contaminant 96. Coupling between coupling element 194 and contaminant 96 may occur in any manner discussed above with respect to coupling elements 94 and contaminant 96.

Immiscible components 111 may be entrained in suspension 190 before being disposed on substrate 11. Alternatively, immiscible components 111 may be entrained in suspension 190 in-situ as suspension is being deposited on surface 98 and/or may be generated by impact of suspension 190 with surface 98 thereby entraining gases, such as air, present in the surrounding ambient, e.g., generating a foam. In one example, immiscible components 111 may be generated from a gas dissolved within liquid region 192 that comes out of solution upon suspension 190 being subjected to a decrease in ambient pressure relative to pressure of suspension 190. One advantage of this process is that the majority of immiscible components 111 will form proximate to coupling elements 194, due to coupling elements 194 have moved settled under force gravity toward surface 98. This increases the probability that coupling elements 194 coupling with contaminant 96.

As with bi-state suspension 90, tri-state suspension 190 may include additional components to modify and improve the coupling mechanism between coupling elements 194 and contaminant. For example, the pH of the liquid medium can be modified to cancel surface charges on one or both of the solid component and contaminant such that electrostatic repulsion is reduced or amplified. Additionally, the temperature cycling of suspension 190 may be employed to control, or change, the properties thereof. For example, coupling elements 94 may be formed from a material, the malleability of which may change proportionally or inversely proportionally with temperature. In this fashion, once coupling elements 94 conform to a shape of contaminant, the temperature of suspension may be changed to reduce the malleability thereof. Additionally, the solubility of suspension 190 and, therefore, the concentration of coupling elements 94 may vary proportionally or inversely proportionally with temperature.

An exemplary suspension 190 is fabricated by combining Stearic acid solids, heated above 70° Celsius, to DIW heated above 70° Celsius. The quantity of Stearic acid solids combined with the DIW is approximately 0.1% to 10%, inclusive by weight. This combination is sufficiently to disperse/emulsify the Stearic acid components within the DIW. The pH level of the combination is adjusted above 9 to neutralize the stearic acid components. This is achieved by adding a base, such as ammonium hydroxide ($NH_4OH$) to provide a concentration of 0.25% and 10%, inclusive by weight. In this manner, an acid-base mixture is formed, which is stirred for 20 minutes to ensure the homogeneity of the mixture. The acid-base mixture is allowed to reach ambient temperature and precipitate to form coupling elements 194. It is desired that coupling elements 194 formed during precipitation reach a size in a range of 10 to 5000 micrometers, inclusive. Immiscible component 111 may be formed from entrainment of air within the acid-base mixture as the same is stirred, if desired.

In another embodiment, suspension 190 is formed by from granular Stearic acid solids milled to a particle size in a range of 0.5 to 5000 micrometers, inclusive. The milled Stearic acid in granular form is added to DIW while agitating the same to form an acid-DIW mixture. Agitation of the DIW may occur by any means known, such as shaking, stirring, rotating and the like. The Stearic acid forms approximately 0.1% to 10%, inclusive, by weight of the acid-DIW mixture. Dissociation of the Stearic acid is achieved by establishing the pH level of the acid-DIW mixture to be approximately 9 by adding a base. An exemplary base includes ammonium hydroxide ($NH_4OH$) in a concentration of 0.5% to 10%, inclusive by weight. This ionizes the Stearic acid component forming solidified Stearic acid particles. Typically the $NH_4OH$ is added to the acid-DIW mixture while the same is being agitated to disperse the solidified Stearic acid particles throughout the acid-DIW mixture. The size distribution of these solidified Stearic acid particles is in a range of 0.5 to 5,000 micrometers, inclusive.

In yet another embodiment, suspension 190 is formed from a Stearic-palmitic acid mixture dissolved in isopropyl alcohol (IPA) while the IPA is agitated, as discussed above. This provides a concentration of dissolved fatty acids present in the concentration from a range 2% to 20%, inclusive by weight. Heating of the IPA while avoiding boiling of the same and/or adding an organic solvent, such as acetone, benzene or a combination thereof, may improve solubility of the fatty acid. Any solids remaining in the concentration following dissolution may be removed by filtration or centrifugation techniques, producing a solid-free solution. The solid-free solution may be mixed with a liquid that is a nonsolvent, to the fatty acid, such as water, to precipitate a fatty-acid solid. The precipitated fatty acid becomes suspended in solution with the size distribution in the range between 0.5 and 5,000 microns, inclusive. The Stearic acid component may be ionized, as discussed above.

While this invention has been described in terms of several embodiments, it will be appreciated that those skilled in the art upon reading the preceding specifications and studying the drawings will realize various alterations, additions, permutations and equivalents thereof. Therefore, it is intended that the present invention includes all such alterations, additions, permutations, and equivalents as fall within the true spirit and scope of the invention. In the claims, elements and/or steps do not imply any particular order of operation, unless explicitly stated in the claims.

What is claimed is:

1. A method for cleaning a surface, having particulate matter interspersed thereon, of a substrate, said method comprising:
    impinging a liquid having coupling elements and immiscible gas components entrained therein upon said surface, said impinging being configured to scan the liquid over and across an entire area of the surface of the substrate, said coupling elements being deformable non-crystalline solids and said substrate being a wafer, wherein the immiscible gas components comprise 50% to 95%, inclusive, of the liquid by weight; and
    imparting sufficient drag upon said coupling elements to move within said liquid and impart a quantity of said drag upon said particulate matter, with said quantity being of sufficient magnitude to cause said particulate matter to move with respect to said substrate.

2. The method as recited in claim 1 wherein imparting further includes providing said coupling elements and said liquid with relative momentum to facilitate said coupling elements contacting said particulate matter and cause said particulate matter to move with respect to said substrate, wherein a hardness of said coupling elements is less than a hardness of said surface.

3. The method as recited in claim 1 wherein imparting further includes scanning a jet to have said liquid impact said surface at different angles measured from a normal to said surface.

4. The method as recited in claim 1 wherein imparting further includes scanning a jet along a first direction to have said liquid impact upon said surface at different angles measured from a normal to said surface while generating relative movement between said jet and said surface along a plane that extends transversely to said jet.

5. The method as recited in claim 1 wherein impinging further includes directing a jet along a path to have said liquid impact upon said surface while generating different angles between said path and a normal to said surface, said normal lying in a plane extending orthogonally from said surface, with said path being positioned at different angles with respect to said plane.

6. The method as recited in claim 1 further including generating a foam of said liquid upon said surface.

7. The method as recited in claim 1 wherein impinging further includes directing a jet of said liquid upon said surface and further including terminating said jet and generating foam from said liquid upon said surface.

8. The method as recited in claim 1 wherein impinging further includes directing a jet of said liquid upon said surface and further including terminating said jet and generating a foam of said liquid upon said surface and exposing said foam to a fluid to remove the foam from the surface and exposing said fluid to a vacuum to remove a quantity of the same.

9. A method for cleaning a surface, having particulate matter thereon, of a substrate, said method comprising:
    scanning a jet of a liquid, having coupling elements and immiscible gas components entrained therein over and across an entire area of the surface of the substrate, the scanning occurring along a first direction to impinge upon said surface at different angles measured from a normal to said surface while generating relative movement between said jet and said surface along a plane that extends transversely to said normal to impart sufficient drag upon said coupling elements to move within said liquid and impart a quantity of said drag upon said particulate matter, with said quantity being of sufficient magnitude to cause said particulate matter to move with respect to said substrate, wherein the immiscible gas components comprise 50% to 95%, inclusive, of the liquid by weight;
    wherein said coupling elements are deformable non-crystalline solids that at least partially conform to some of the particulate matter to assist in the cleaning of the particulate matter off of said surface and said substrate being a wafer.

10. The method as recited in claim 9 wherein said normal lies in a plane extending orthogonally from said surface and scanning further includes directing said jet at different angles with respect to said plane.

11. The method as recited in claim 9 further including generating a foam of said liquid upon said surface.

12. The method as recited in claim 9 further including terminating said jet and generating foam of said liquid upon said surface.

13. The method as recited in claim 9 further including terminating said jet and generating a foam of said liquid upon said surface and exposing said foam to a fluid to remove the foam from the surface and exposing said fluid to a vacuum to remove a quantity of the same.

14. A method for cleaning a surface, having particulate matter thereon, of a substrate, said method comprising:
    impinging upon said surface liquid having coupling elements and immiscible gas components entrained therein by scanning a jet of said liquid over and across an entire area of said surface to impart sufficient drag upon said coupling elements to move within said liquid and impart a quantity of said drag upon said particulate matter, with said quantity being of sufficient magnitude to cause said particulate matter to move with respect to said substrate;
    wherein said coupling elements include non-crystalline solids with a hardness less than a hardness of the surface of the substrate, that at least partially conform to some of the particulate matter to assist in the cleaning of the particulate matter off of said surface and said substrate being a wafer and wherein the immiscible gas components comprise 50% to 95%, inclusive, of the liquid by weight.

15. The method as recited in claim 14 wherein impinging further includes directing a jet of said liquid upon said surface and further including terminating said jet and generating a foam of said liquid upon said surface and exposing said foam to a fluid to remove the foam from the surface and exposing said fluid to a vacuum to remove a quantity of the same.

16. The method as recited in claim 14 wherein impinging further includes directing said jet along a path to have said liquid impact upon said surface while generating different angles between said path and a normal to said surface, said normal lying in a plane extending orthogonally from said surface, with said path being positioned at different angles with respect to said plane.

17. The method as recited in claim 14 wherein impinging further includes scanning said jet to have said liquid impact said surface at different angles measured from a normal to said surface.

18. The method as recited in claim 17 wherein impinging further includes terminating said jet and generating foam from said liquid upon said surface.

19. The method as recited in claim 18 wherein impinging further includes providing said coupling elements and said liquid with relative momentum to facilitate said coupling elements contacting said particulate matter and cause said particulate matter to move with respect to said substrate.

* * * * *